United States Patent [19]

Taylor, Jr.

[11] 4,286,043

[45] Aug. 25, 1981

[54] NEGATIVE-WORKING DRY PEEL APART PHOTOPOLYMER ELEMENT WITH POLYVINYLFORMAL BINDER

[75] Inventor: Harvey W. Taylor, Jr., Sayre, Pa.

[73] Assignee: E. I. Du Pont de Nemours and Company, Wilmington, Del.

[21] Appl. No.: 152,118

[22] Filed: May 21, 1980

[51] Int. Cl.³ ............... G03C 1/72; G03C 1/94; G03C 1/68
[52] U.S. Cl. ................... 430/253; 430/252; 430/281; 430/314; 430/315; 430/323; 430/324; 430/905; 430/907; 430/908; 430/909; 430/910
[58] Field of Search ............ 430/252, 253, 281, 314, 430/315, 323, 324, 905, 907, 908, 909, 910

[56] References Cited

U.S. PATENT DOCUMENTS

| | | | |
|---|---|---|---|
| 3,202,508 | 8/1965 | Heiart | 430/253 |
| 3,264,103 | 8/1966 | Cohen et al. | 430/254 |
| 3,353,955 | 11/1967 | Colgrove | 430/255 |
| 3,607,264 | 9/1971 | Celeste | 430/254 |
| 3,770,438 | 11/1973 | Celeste | 430/253 |
| 4,058,443 | 11/1977 | Murata et al. | 430/281 |
| 4,127,436 | 11/1978 | Friel | 156/630 |

*Primary Examiner*—Edward C. Kimlin

[57] ABSTRACT

A negative-working dry peel apart photopolymerizable element consisting essentially of a photopolymerizable layer between a support and cover sheet, the photopolymerizable layer containing (1) at least two halogen-free polymeric organic binders, (2) a photoinitiator system and (3) at least one monomer present in an amount in excess of the absorptive capacity of the binders for the monomer, at least one polymeric binder which is incompatible in the layer contains 0.5 to 40.0% by weight of polyvinylformal based on the total weight of polymeric binder and is present as a dispersed phase in the layer. The element is useful in color projection transparencies, seismic readout and as photoresists.

8 Claims, No Drawings

NEGATIVE-WORKING DRY PEEL APART PHOTOPOLYMER ELEMENT WITH POLYVINYLFORMAL BINDER

TECHNICAL FIELD

This invention relates to a negative-working dry peel apart photopolymerizable element and more particularly to a photopolymerizable element wherein polyvinylformal is present as a component of the polymeric binder.

BACKGROUND ART

Negative-working dry peel apart photopolymerizable elements are known. These elements are described as being particularly useful as photoresists for preparing printed circuits including photoresists for tenting. Such elements can also be used in the preparation of both negative and positive images of good quality from one simple operation at room temperature.

U.S. Pat. No. 3,770,438 discloses a dry-developing photopolymerizable layer on a polymer film support operating according to the principle of the polymerizable monomer being present in the layer in a quantity in excess of the absorptive capacity of the binder so that a thin layer of substantially free monomer is present on the surface of the photopolymerizable layer. This free monomer is detectible on the surface of a substrate such as copper as an oily residue when the layer is peeled off of the copper prior to any photoexposure of the layer. The free monomer polymerizes when photoexposed to actinic radiation, to adhere the exposed area of the layer to the copper substrate more strongly than to the film support. The greater affinity of the monomer for the film support than the copper substrate in the unexposed area of the layer enables the unexposed area of the layer to remain adhered to the film support. Different ways for achieving an excess of monomer are used in the patent, e.g., using a hydrocarbon polymer binder and a very large proportion of monomer (77.5% in Ex. 3), using a chlorocarbon polymer binder having a lesser absorptive capacity for the monomer, thereby reducing the monomer content to 40–50% (Ex. 9, 13, 15 & 16), or using a combination of a chlorocarbon polymer (M. wt. about 20,000) and higher molecular weight (about 60,000) poly(methylmethacrylate) to decrease the flow of the layer. The amount of chlorocarbon polymer used ranged from 24.6 to 41.1 by wt., the amount of hydrocarbon polymer from 3 to 29.4% by wt. and the amount of monomer ranged from 24.2 to 65.6% by wt. (Ex. 1, 2, 5–8, 12, 14, and 16). The disadvantage of the dry-developing photopolymerizable layer of this patent was that either the flow of the layer at ordinary room temperature was too great or the fidelity of the image reproduced by the layer was less than desired. As the flow of the photopolymerizable layer was reduced in an attempt to provide a layer that could be supplied in the form of a roll, as required for commercial acceptance, the layer would either not fail cohesively at the boundary between the unexposed area and exposed area of the layer with a smooth, sharp break to give the image fidelity desired or would not fail cohesively at all, i.e., even the unexposed area of the layer would adhere to the substrate when the film support was peeled away. Layers that gave good image fidelity upon dry development were tacky so that it was difficult to remove a cover sheet that may be laminated to a surface of the layer.

U.S. Pat. No. 4,058,443 disclosing another peel apart system states that the mechanical strength of photopolymerizable layers used for dry development are apt to have insufficient mechanical strength which is important when the layer is used as a tenting resist. U.S. Pat. No. 4,058,443 purports to solve this problem by having the binder of the photopolymerizable layer, in addition to chlorinated polyolefin, consist of 10 to 90% of a straight-chained polymeric material having sufficient compatibility with the other components of the layer and having a molecular weight of at least 10,000, with a range of up to 2,000,000 being disclosed. The chlorinated polyolefin is also claimed to have a polymerization degree of 600 to 20,000 which for chlorinated polypropylene (64% by wt. Cl) corresponds to a molecular weight of about 34,000 to 2,200,000. The resist utility disclosed in this patent is as an etching resist. The layers of this patent are either too flowable or when not too flowable, they have deficient image fidelity upon dry development. In addition, the conditions for peeling away the support film to achieve dry development are too exacting for commercial practice. As such these layers have nothing more than laboratory application.

Cohen and Gervay U.S. application Ser. No. 015,245, filed Feb. 26, 1979 discloses dry-developing photosensitive dry film resists containing polymerizable monomer in excess of the absorptive capacity of the layer, photoinitiator system and a plurality of polymeric binders, at least one of the polymeric binders being incompatible so as to be present as a dispersed phase in the photopolymerizable layer to reduce the cohesive strength of the layer. The incompatible polymeric binder in the photosensitive layer has a glass transition temperature (Tg) of less than 70° C. It is desirable to prepare other photosensitive elements possessing the advantages of U.S. application Ser. No. 015,245 which contain incompatible polymeric binders having glass transition tempuerates above 70° C. which are not only useful as photoresists but for other uses including the preparation of high resolution negative and positive color projection transparencies, etc.

DISCLOSURE OF THE INVENTION

In accordance with this invention there is provided a negative-working dry peel apart photopolymerizable element consisting essentially of a support, a cover sheet and therebetween a layer of photopolymerizable composition having a dry thickness of at least 0.0005 mm and an optical density in the actinic region of not more than 0.7, the photopolymerizable composition consisting essentially of (1) at least two halogen-free polymeric organic binders, (2) a free radical generating, addition polymerization initiator or initiator system activatable by actinic radiation, and (3) at least one ethylenically unsaturated monomer having a boiling point above 100° C. at normal atmospheric pressure and at least one terminal ethylenic group capable of forming a high polymer by free radical initiated, chain-propagated, addition polymerization, the monomer being present in a quantity in excess of the absorptive capacity of the binders for the monomer so that a thin layer of substantially free monomer is present at least on the surface of the photopolymerizable layer at the interface between the layer and the cover sheet, the adhesion of the photopolymerizable layer to the cover sheet being greater before polymerization than it is to be support whereas after polymerization the adhesion of said layer to the support is greater than it is to the cover sheet, at least one of the support or cover sheet being transparent to actinic radiation, the improvement being that the ratio of binder components to monomeric component is 0.5 to 1.0 to 3.0 to 1.0, at least one of the polymeric organic binders contains 0.5 to 40.0 percent by weight of polyvinylformal based on the total weight of polymeric binder present and is incompatible so as to be present as a dispersed phase in the layer to provide an appreciable reduction in cohesive strength of the photopolymerizable layer as compared to when the incompatible binder is not present in the layer.

Sandwiched between a support and a cover sheet is a layer of a photopolymerizable composition having a dry thickness of at least 0.0005 mm. Thicker photopolymerizable layers can be 0.019 mm or more in thickness. A preferred photopolymerizable layer thickness range is 0.0025 to 0.005 mm.

The present invention utilizes the principle of excess monomer of U.S. Pat. No. 3,770,438 but has found that image fidelity does not have to be sacrificed as in this patent and U.S. Pat. No. 4,058,443 when layer flowability is reduced. The present invention provides a measure of decreased flowability, nontackiness or low enough tack for easy stripping of the cover sheet, with high image fidelity by providing a heterogeneous photopolymerizable layer in which a disperse phase of polyvinylformal-containing halogen-free polymeric binder is present in the layer. This is in contrast to the compatibility requirement disclosed in U.S. Pat. No. 4,058,443. The utilization of halogen-containing polymeric binders is also not required.

The photopolymerizable layer possesses flowability at elevated temperatures, e.g., lamination temperatures, but the layer has sufficiently low flow at normal room temperature (20° C.) that the layer sandwiched between a film support and cover sheet can be rolled up into a tight roll package of at least 50 layers for handling and storage convenience and without substantial decrease in original layer thickness.

The photopolymerizable layer used in the dry peel apart element of the invention is composed of halogen-free polymeric organic binders, monomer and photoinitiators which bear a certain relationship to each other and to the layer in toto, and these components are combined into the layer in a special way to bring about the dispersed phase of incompatible binder relationship. It is necessary that 0.5 to 40.0 percent by weight of polyvinylformal based on the total weight of polymeric binder is present. At least one of the polymeric binders can contain this amount of polyvinylformal or the amount of polyvinylformal can be present in more than one binder.

In formulating the photopolymerizable layer, the components are added to solvent being stirred at room temperature. Preferably sufficient solvent is present, i.e., solids concentration is low enough, that the stirring produces a solution of the components, thereby insuring complete mixing thereof. Surprisingly, when stirring is stopped, the liquid medium is clear in appearance.

The solvent for the medium is chosen so that the phase separation does not occur before or when the medium is coated on a surface and dried to form the photopolymerizable layer. The dispersed incompatible binder phase should form in the layer during drying. Methylene chloride is a satisfactory solvent. Methanol in small amounts can be present. Other useful solvents include: methyl ethyl ketone, toluene, trichloroethane, ethyl and butyl Cellosolve, tetrahydrofuran, etc. In general, most ketones, esters and low boiling aromatic solvents are useful.

The dispersed phase can be seen in the photopolymerizable layer through a phase contrast microscope for example at about 100X magnification. The dispersed phase has been observed in the continuous phase as minute, discrete, circular-like domains which appear narrower in cross-section. The size of the domains is greater than colloidal in size.

The dispersed phase functions in the layer by reducing the cohesive strength of the layer. Cohesive strength is tested by the amount of force needed to peel away the support sheet from the photoexposed area of the layer adhered to a surface. The force is measured using a tensile strength tester (Instron), and the cohesive strength measured is the force needed to break the thickness of the layer at the boundary between the photoexposed area of the layer and the unexposed area thereof.

This reduction in cohesive strength of the layer is believed to be caused by the cohesive break occurring along interfaces between the incompatible phases or by fracture of the incompatible phase at the boundary between exposed and unexposed areas. Where the incompatible phase is present as discrete domains in the layer, the presence of these domains shortens the path length of the cohesive failure within the continuous phase of relatively high cohesive strength, from discrete domain to discrete domain to appreciably reduce the cohesive strength of the layer. This requires that the adhesion between the phases is low relative to the cohesive strength of the layer without the incompatible polymeric binder. Preferably, a reduction in cohesive strength of at least 25%, and more preferably at least 50%, and even more preferably at least 75% is obtained, as compared to when no incompatible polymer binder is present, provided that the layer (unexposed area) still has sufficient cohesive strength to be removed from the surface to which it is laminated.

With respect to the composition of the photopolymerizable layer, the plurality of binders are selected to produce the incompatibility hereinbefore described and to impart a relatively no flow condition to the layer at ordinary room temperature (20° C.). This incompatibility results from chemical dissimilarity of the binder polymers and/or differences in molecular weight to produce a lack of affinity of at least one polymeric binder to another polymeric binder of the binder component.

Polymeric organic binders present in the photopolymerizable composition must be halogen-free and at least 0.5 to 40.0 percent by weight, preferably 1 to 10 percent, and more preferably 1 to 5 percent, by weight, of polyvinylformal based on the total weight of polymeric binder is present. Preferably the average molecular weight of all polymeric binders is at least 10,000. At levels below 0.5% by weight polyvinylformal the peel apart tendency is lost. At levels of polyvinylformal above about 40% by weight part of the photopolymer may adhere to the support and part to the cover sheet without a clean cohesive break at the exposed/unexposed interface of the layer. A preferred binder combination is poly(butylmethacrylate/isobutylmethacrylate), terpolymer of polyvinylacetal/polyvinyl alcohol/polyvinylformal, and polymethymethacrylate. Other useful combinations of polymeric binders include: polymethyl methacrylates/polyvinyl butyral/polyvinylformal, styrene/maleic anhydride copolymer and terpolymer of polyvinylacetal/polyvinyl alcohol/polyvinylformal, etc.

The incompatible polymer can be one or more of the above polymers. Polymethylmethacrylate, however, has been found not to produce a dispersed phase in a photopolymerizable layer containing the polyvinylformal binder. Preferably the incompatible polymeric binder has a glass transition temperature (Tg), as measured by differential scanning calorimetry, of greater than 70° C., which is characteristic of the above-mentioned specific polymers. It is desirable that the incompatible polymer be soluble in solvent which dissolves the other components of the composition used to make the layer.

The remaining major components of the layer are the monomer and photoinitiator. The monomer preferably has at least one terminal ethylenically unsaturated group and is liquid at ordinary room temperature and has a boiling point in excess of 100° C. Examples of monomers include one or more of the following monomers: pentaerythritol triacrylate, trimethylolpropane triacrylate, ethylene glycol diacrylate and dimethacrylate, diethylene glycol diacrylate and other monomers disclosed in U.S. Pat. No. 3,770,438. The amount of monomer present in the layer is an amount in excess of the absorptive capacity of the layer, as indicated by a monomer-rich phase being present on a copper surface to which the layer is laminated and then delaminated (without photoexposure) after letting stand for a reasonable period of time, e.g., two hours. Since the polymeric binder is the component of the layer possessing absorptive capacity for the monomer, then the monomer is present in an amount in excess of the absorptive capacity of the polymeric binder component. Each polymeric binder has its own absorptive capacity for the monomer, so the amount of monomer required will depend on the polymer present as the binder component as well as on the type of monomer. The proportion of incompatible polymer, e.g., should not be so high that while it reduces cohesive strength, it soaks up the excess monomer to cause the exposed image to lose adhesion to the surface to which it is laminated.

Examples of photoinitiators include Michler's ketone, benzophenone, thioxanthenone, 2-chlorothioxanthenone 9,10-phenanthrenequinone, 2-t-butylanthraquinone, combinations of hexaarylbisimidazoles and leuco dyes and hexaarylbisimidazoles and mercaptan chain transfer agents, e.g., 2-mercaptobenzoxazole, 2-mercaptobenztriazole, etc. The photoinitiator can consist of one or more components which act separately or in combination to initiate polymerization of the monomer.

The photopolymerizable compositions generally exhibit their maximum sensitivity in the ultraviolet range, and the radiation source should furnish an effective amount of this radiation. Such sources include: carbon arcs, mercury-vapor arcs, fluorescent lamps with special ultraviolet-emitting phosphors, argon glow lamps, electronic flash units and photographc flood lamps. The amount of exposure required for satisfactory reproduction of a given photopolymerizable layer is a function of exposure time, type of radiation source used, and distance between the radiation source and layer surface. In general, exposure times are relatively short using standard commercial radiation sources, e.g., 10 seconds to 3 minutes or more.

The layer can have present a plasticizer for one or more of the polymeric binders. Examples of plasticizers include: mixed ester of triethylene glycol dicaprate and dicaprylate, chlorinated paraffin and cetyl ether of polyoxyethylenealcohol. The plasticizer increases the elevated temperature flowability of the layer without making the flow at ordinary room temperature too high.

Other ingredients which can be present in the photopolymerizable layer are thermal polymerization inhibitors and colorants. Both of these components are known to those skilled in the art. Inhibitors are generally present with the monomeric component. The colorants preferably do not strongly absorb radiation in the spectral range in which the photoinitiator absorbs radiation.

The photopolymerizable layer contains based on the total weight of the composition.

(a) binders, 30 to 75% by weight, preferably 44 to 60% by weight;
(b) monomer(s), 20 to 65% by weight, preferably 34 to 50% by weight, and
(c) photoinitiator, 0.5 to 5.0%, preferably 3.0 to 4.0% by weight. The ratio of binders to monomer components ranges from 0.5 to 1.0 to 3.0 to 1.0, preferably 1.1 to 1.0 to 1.8 to 1.0. The ratios naturally vary according to the components present in the photopolymerizable compositions.

The photopolymerizable composition is made into a dry layer by solution blending of the described components to make a uniform liquid, coating the liquid onto a cover sheet which provides dimensional stability to the layer after drying, drying the liquid to form a layer on the cover sheet, followed by laminating the photopolymerizable layer and accompanying cover sheet to a support. The photopolymerizable composition can be applied to its surface by methods known to those skilled in the art, e.g., extrusion coating, solution coating using a doctor blade, skim, hopper, reverse roll. The coating thickness ranges from about 20 to 60 mg/dm$^2$, preferably 35 to 40 mg/dm$^2$.

Suitable cover sheets that the photopolymerizable composition is coated on are polyethylene terephthalate which is not coated with a subbing layer, electric discharge or flame treated polyethylene terephthalate, polypropylene, etc. Polyethylene is also useful provided that the coating is accomplished without tearing the film. The supports to which the dry photopolymerizable layer is laminated include: gelatin-subbed polyethylene terephthalate, polycarbonate film, glass epoxy boards, copper and aluminum surfaces, etc. Also useful as supports are Saran ® coated polyethylene terephthalate and aluminized polyethylene terephthalate, etc.

The dry layer is of uniform thickness and has sufficient viscosity (no flow) that the layer can be wound up under sufficient tension that the resultant roll does not telescope when held verticlly with the core for the roll unsupported. Typically, such roll will have at least 100 layers of photopolymerizable layer and more often at least 300 layers thereof.

BEST MODE FOR CARRYING OUT THE INVENTION

The best mode for carrying out the invention is illustrated in Example 1 wherein the terpolymer containing polyvinylformal is present in the photopolymerizable layer as a dispersed phase.

INDUSTRIAL APPLICABILITY

The peel apart photopolymerizable element of this invention is useful in the preparation of high resolution negative and positive color projection transparencies, particularly for overhead projection equipment. The elements are also useful in seismic readout. Photoresists, e.g., plating and etching, can also be prepared from the photopolymerizable elements.

In the formation of color projection transparencies, the suitably dye element is exposed to actinic radiation through a separation negative related to the color of the element. The cover sheet is peeled away, e.g., at a 180° C. angle, preferably at room temperature, whereby the unexposed areas of the layer are removed with it, leaving the exposed image areas on the support. The resolution is from 5 to 60 on a 100 line screen tint. Low peel force is required and a wide latitude in peel rate, e.g., 5 to 50 inches/minute at room temperature, can be used.

EXAMPLES

The following examples illustrate the invention. In the examples polyvinylformal is present in one of the polymeric binders of the photopolymerizable composition in an amount that the binder is incompatible and is present as a dispersed phase in the photopolymerizable layer.

EXAMPLE 1

A photopolymerizable composition is prepared using the following ingredients in the amounts indicated:

| Ingredients | Amount (g) |
| --- | --- |
| Methylene chloride | 250.0 |
| Terpolymer of polyvinylformal (62–82%)/polyvinylacetal (9.5 to 13.0%)/polyvinyl alcohol (5.0 to 6.5%, weight average molecular weight 140,000 to 170,000) | 1.0 |
| Polymethylmethacrylate, weight average molecular weight 30,000 | 5.8 |
| Poly(butylmethacrylate/isobutyl methacrylate) weight average molecular weight 200,000 | 2.8 |
| Trimethylolpropane triacrylate | 8.8 |
| 2-Mercaptobenzoxazole | 0.1 |
| 2,2'Bis-(2-chlorophenyl)-4,4'5,5'-tetraphenyl biimidazole | 0.4 |
| CI-109 Red dye | 1.0 |
| Methanol | 20.0 |

The ingredients are thoroughly mixed and coated onto a 0.0025 cm thick transparent polyethylene terephthalate support using a 0.0127 cm doctor knife. The resulting photopolymerizable layer has a coating weight of 40 mg/dm². The photopolymerizable layer is then laminated at 93° C. to a 0.010 cm thick transparent polyethylene terephthalate film having a surface which is first resin subbed and then gelatin subbed according to U.S. Pat. No. 3,567,452. The resulting laminated sandwich consists of a photopolymerizable layer between untreated polyethylene terephthalate and gel-subbed polyethylene terephthalate. A sample of this coating is exposed for 30 to 35 seconds through a negative target with the untreated polyethylene terephthalate facing the pulsed xenon source of a 2000 watt nuArc® platemaker (nuArc Co. Inc., Chicago, Ill.). The sample is peeled at a slow to moderate rate at a 180° peel angle whereby the exposed image areas of the photopolymerizable layer remain on the gelatin subbed polyethylene terephthalate and the unexposed areas of the photopolymerizable layer are removed with the untreated polyethylene terephthalate which serves as a cover sheet. Samples of this dry, room temperature peel apart film are exposed through both 100 line and 150 line screen tint negatives to produce high resolution images. Similar results are obtained when polypropylene film is used in place of untreated polyethylene terephthalate.

EXAMPLE 2

A photopolymerizable composition is prepared as described in Example 1 except that Victoria Pure Blue Dye CI-7 is substituted for CI-109 Red dye. The photopolymer composition is first coated as described in Example 1, but it is then laminated at 100° C. to a brush grained anodized 0.3 cm thick aluminum plate. After a 10 second exposure as described in Example 1 through a negative target, the untreated polyethylene terephthalate cover sheet is peeled off to produce a high resolution negative image on the aluminum plate.

EXAMPLE 3

A photopolymerizable composition is prepared with the following ingredients:

| Ingredients | Amount (g) |
| --- | --- |
| Methylene chloride | 250.0 |
| Polyvinylformal containing terpolymer described in Example 1 | 1.0 |
| Polymethylmethacrylate, weight average molecular weight 30,000 | 5.07 |
| Poly(butylmethacrylate/isobutyl methacrylate) weight average molecular weight 200,000 | 3.53 |
| Trimethylolpropane triacrylate | 8.8 |
| 2-Mercaptobenzoxazole | 0.1 |
| 2,2'Bis-(2-chlorophenyl)-4,4'5,5'-tetraphenyl biimidazole | 0.4 |
| CI-109 Red dye | 1.0 |
| Methanol | 20.0 |

The ingredients are thoroughly mixed and coated on untreated polyethylene terephthalate to give a coating weight of 38 mg/dm². Samples of the photopolymerizable layer are then laminated at 102° C. to a glass epoxy board of the type used for printed circuits and also to a board clad with a 0.025 cm copper coating used for etching resist operations. The laminates are exposed 40 seconds as described in Example 1 through a negative target placed on the untreated polyethylene terephthalate which serves as a cover sheet. The samples are peeled as described in Example 1 and both give high resolution negative images on both the glass epoxy circuit board and copper clad resist plate.

EXAMPLE 4

Eleven photopolymerizable compositions are prepared using the ingredients set forth in the Table in the amounts indicated. After thoroughly mixing the ingredients, the mixtures are coated onto a 0.0025 cm thick polyethylene terephthalate support with a 0.051 mm doctor knife. The photopolymerizable layers are then laminated at 220° C. to 0.10 mm thick transparent polyethylene terephthalate film treated as described in Example 1. The coatings are then exposed for 10 seconds through a negative line target using the radiation source described in Example 1. The results are set forth after the Table. Sample 1 illustrates a control.

TABLE

| Ingredients* | Samples (g) | | | | | | | | | | |
|---|---|---|---|---|---|---|---|---|---|---|---|
| | 1 | 2 | 3 | 4 | 5 | 6 | 7 | 8 | 9 | 10 | 11 |
| Polymethylmethacrylate weight average mol. weight 30,000 | 5.83 | 5.80 | 5.73 | 5.68 | 5.55 | 5.35 | 5.02 | 4.69 | 4.69 | 2.83 | 1.96 |
| Polymethylmethacrylate weight average mol. weight 500,000 | 1.09 | 1.06 | 0.99 | 0.93 | 0.93 | 0.93 | 0.93 | 0.93 | 0.93 | 0.93 | 1.00 |
| Polyvinylformal terpolymer described in Ex. 1 | 0.0 | 0.090 | 0.30 | 0.50 | 0.69 | 0.99 | 1.48 | 1.98 | 2.47 | 3.96 | 4.92 |
| Poly(butylmethacrylate/isobutylmethacrylate) weight average mol. weights 200,000 | 2.96 | 2.93 | 2.86 | 2.80 | 2.73 | 2.63 | 2.47 | 2.30 | 1.81 | 2.15 | 1.96 |
| % Polyvinyl formal present | 0 | 1 | 3 | 5 | 7 | 10 | 15 | 20 | 25 | 40 | 50 |

*All samples contain 250.0 g methylene chloride, 8.80 g trimethylolpropane triacrylate, 0.60 g biimidazole compound of Example 1, 0.10 g 2-mercaptobenzoxazole, and 0.50 g of Cl-109 Red dye Results:
Sample
1 - no peel apart image obtained
2-4 - excellent image
5-6 - good image
7-10 - image with some cohesive break
11 - image with much cohesive break

I claim:

1. A negative-working dry peel apart photopolymerizable element consisting essentially of a support, a cover sheet and therebetween a layer of photopolymerizable composition having a dry thickness of at least 0.0005 mm and an optical density in the actinic region of not more than 0.7, the photopolymerizable composition consisting essentially of (1) at least two halogen-free polymeric organic binders, (2) a free radical generating, addition polymerization initiator or initiator system activatable by actinic radiation, and (3) at least one ethylenically unsaturated monomer having a boiling point above 100° C. at normal atmospheric pressure and at least one terminal ethylenic group capable of forming a high polymer by free radical initiated, chain-propagated, addition polymerization, the monomer being present in a quantity in excess of the absorptive capacity of the binders for the monomer so that a thin layer of substantially free monomer is present at least on the surface of the photopolymerizable layer at the interface between the layer and the cover sheet, the adhesion of the photopolymerizable layer to the cover sheet being greater before polymerization than it is to the support whereas after polymerization the adhesion of said layer to the support is greater than it is to the cover sheet, at least one of the support or cover sheet being transparent to actinic radiation, the improvement being that the ratio of binder components to monomeric component is 0.5 to 1.0 to 3.0 to 1.0, at least one of the polymeric organic binders contains 0.5 to 40.0 percent by weight of polyvinylformal based on the total weight of polymeric binder present and is incompatible so as to be present as a dispersed phase in the layer to provide an appreciable reduction in cohesive strength of the photopolymerizable layer as compared to when the incompatible binder is not present in the layer.

2. An element according to claim 1 wherein the support is a flexible film.

3. An element according to claim 2 wherein the cover sheet is a flexible film.

4. An element according to claim 3 having sufficient viscosity to be wound up into a tight roll without substantial decrease in layer thickness.

5. An element according to claim 1 wherein the polymeric binders are: poly(butylmethacrylate/isobutylmethacrylate), terpolymer of polyvinylacetate/polyvinyl alcohol/polyvinylformal and polymethylmethacrylate.

6. An element according to claim 1 wherein the support is a gelatin subbed polyethylene terephthalate support.

7. An element according to claim 6 wherein the dry coating weight of the photopolymerizable layer on the support is 20 to 60 mg/dm$^2$.

8. An element according to claim 7 wherein the cover sheet is a film of polyethylene terephthalate.

* * * * *